United States Patent
Nishiura et al.

(10) Patent No.: US 8,347,056 B2
(45) Date of Patent: Jan. 1, 2013

(54) STORAGE APPARATUS AND DATA WRITING METHOD

(75) Inventors: Toshifumi Nishiura, Tokyo (JP); Nobuhiro Kaneko, Kanagawa (JP); Hideaki Okubo, Saitama (JP)

(73) Assignee: Sony Corporation, Tokyo (JP)

( * ) Notice: Subject to any disclaimer, the term of this patent is extended or adjusted under 35 U.S.C. 154(b) by 167 days.

(21) Appl. No.: 13/004,987

(22) Filed: Jan. 12, 2011

(65) Prior Publication Data

US 2011/0179244 A1 Jul. 21, 2011

(30) Foreign Application Priority Data

Jan. 20, 2010 (JP) .................................. 2010-009890

(51) Int. Cl.
*G06F 12/00* (2006.01)
(52) U.S. Cl. ........ 711/166; 711/103; 711/203; 711/209; 365/185.33
(58) Field of Classification Search .................. 711/166, 711/103, 203, 209; 365/185.33
See application file for complete search history.

(56) References Cited

U.S. PATENT DOCUMENTS

| 7,594,157 | B2 * | 9/2009 | Choi et al. | 714/764 |
| 8,239,735 | B2 * | 8/2012 | Shalvi et al. | 714/774 |
| 2007/0233941 | A1 * | 10/2007 | Lee et al. | 711/103 |
| 2009/0150600 | A1 * | 6/2009 | Suda | 711/103 |

FOREIGN PATENT DOCUMENTS

JP 2008-299919 12/2008

* cited by examiner

*Primary Examiner* — Stephen Elmore
(74) *Attorney, Agent, or Firm* — SNR Denton US LLP

(57) ABSTRACT

A storage apparatus is disclosed which includes: a memory configured to have a plurality of pages to which data can be written in units of a page, the memory being further configured to have a plurality of pages of write data stored into each page in multi-valued form; and a control section configured to select pages to which to write the data from among the plurality of pages of the memory, the control section being further configured to write to the selected pages of the memory the data of at least two bits in multi-valued form for a plurality of pages including the selected pages; wherein, when writing the plurality of pages of the write data, the control section puts the write data into multi-valued form per page before writing the data to a plurality of different unused pages of the memory on a page-by-page basis.

6 Claims, 9 Drawing Sheets

| Group 1 | Group 2 | |
|---|---|---|
| Physical Page 0 | Physical Page 1 | → P1 |
| Physical Page 2 | Physical Page 3 | → P2 |
| Physical Page 4 | Physical Page 5 | → P3 |
| Physical Page 6 | Physical Page 7 | → P4 |
| Physical Page 8 | Physical Page 9 | → P5 |
| Physical Page 10 | Physical Page 11 | → P6 |
| Physical Page 12 | Physical Page 13 | → P7 |
| Physical Page 14 | Physical Page 15 | → P8 |

Physical Block A

Physical Block B

Virtual Block A

STORAGE APPARATUS AND DATA WRITING METHOD

BACKGROUND OF THE INVENTION

1. Field of the Invention

The present invention relates to a storage device for storing data in multi-valued form, as well as to a data writing method.

2. Description of the Related Art

Storage apparatuses such as flash memories are capable of storing data of two bits or more per cell in multi-valued form. Illustratively, the storage apparatus disclosed by Japanese Patent Laid-Open No. 2008-299919 allows data of two bits to be written to each cell. When data of two bits or more is stored in each cell in multi-valued form, the storage capacity of the storage apparatus is doubled.

SUMMARY OF THE INVENTION

However, a failure to write data to the storage apparatus that stores data of two bits or more per cell in multi-valued form can lead to an accidental erasure of data held so far in the apparatus. In particular, where data is written to the storage apparatus on a page-by-page basis, data can be deleted inadvertently by the page. If deleted in units of a page, the data is difficult to restore through ordinary error correcting procedures.

The present invention has been made in view of the above circumstances and provides, among others, a storage apparatus offering improved reliability in writing data of two bits or more to each cell in multi-valued form.

In carrying out the present invention and according to one embodiment thereof, there is provided a storage apparatus including: a memory configured to have a plurality of pages to which data can be written in units of a page, the memory being further configured to have a plurality of pages of write data stored into each page in multi-valued form; and a control section configured to select pages to which to write the data from among the plurality of pages of the memory, the control section being further configured to write to the selected pages of the memory the data of at least two bits in multi-valued form for a plurality of pages including the selected pages. When writing the plurality of pages of the write data, the control section puts the write data into multi-valued form per page before writing the data to a plurality of different unused pages of the memory on a page-by-page basis.

Where the above-outlined embodiment of the present invention is in use, the plurality of pages of the write data are written to different unused pages of the memory on a page-by-page basis. Thus during the process of writing the write data, any other page of the write data will not be written to those pages of the memory which already have data written therein.

According to another embodiment of the present invention, there is provided a data writing method including the steps of: selecting, from a memory capable of having a plurality of pages of write data stored therein in multi-valued form, unused pages to which to write a plurality of pages of the write data; putting the write data into multi-valued form on a page-by-page basis; and writing the write data in multi-valued form to the selected unused pages on a page-by-page basis.

According to the present invention embodied illustratively as a storage apparatus for storing data of at least two bits in multi-valued form, the reliability in writing data is enhanced appreciably.

DETAILED DESCRIPTION OF THE PREFERRED EMBODIMENTS

Some preferred embodiments of the present invention will now be described by reference to the accompanying drawings. The description will be given under the following headings:

1. First embodiment (an example wherein data is first written to a virtual block of a nonvolatile memory before being moved from the virtual block to eventual destination blocks); and
2. Second embodiment (an example wherein the movement of data from the virtual block to the eventual destination blocks is performed in a background).

<1. First Embodiment>

[Overall Structure of the Storage Apparatus 1]

Figure 1:
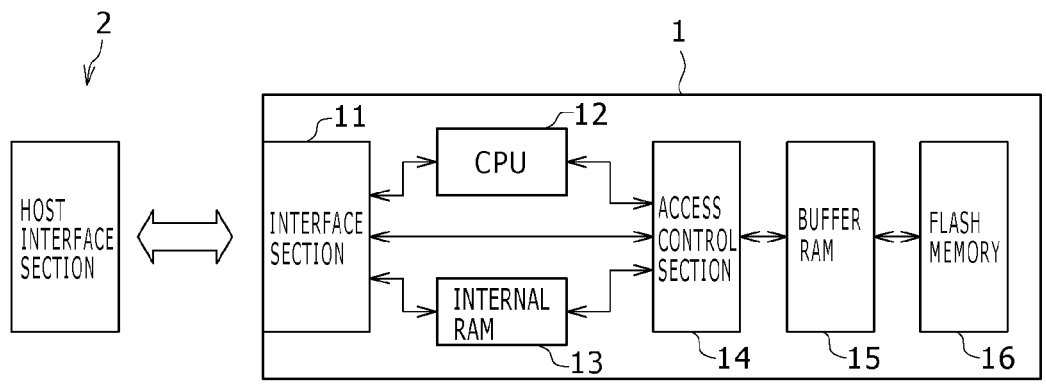
FIG. 1 is a block diagram of a data processing system including a storage apparatus as a first embodiment of the present invention.

FIG. 1 is a block diagram of a data processing system including a storage apparatus 1 as the first embodiment of the present invention. The storage apparatus 1 in FIG. 1 is made up of an interface (I/F) section 11, a CPU (central processing unit) 12, an internal RAM (random access memory) 13, an access control section 14, a buffer RAM 15, and a flash memory 16.

The storage apparatus 1 is illustratively a card-type storage apparatus connected to a host device 2 when used. The host device 2 is illustratively a computer. Such card-type storage apparatuses include Memory Stick (registered trademark) and SD cards to be removably attached to the host device 2.

The storage apparatus 1 puts a plurality of pages of data in multi-valued form when writing the data to the flash memory 16. That is, in the process of writing a plurality of pages of data, the storage apparatus 1 first puts the pages of data into multi-valued form on a page-by-page basis before writing the data to a virtual block. Thereafter, the storage apparatus 1 moves the write data from the virtual block to physical destination blocks.

The interface section 11 has a connector that connects to the interface section 11 of the host device 2. Typically, the interface section 11 complies with the specifications of the Memory Stick (registered trademark) and/or SD cards. When the storage apparatus 1 is connected to the host device 2 via the interface section 11, the host device 2 may access the storage apparatus 1 to write or read data to or from the latter.

The flash memory 16 is illustratively a nonvolatile semiconductor memory such as a NAND or a NOR flash memory 16. The flash memory 16 retains the data written therein after power is removed. As will be explained later, the flash memory 16 is capable of having data written thereto and read therefrom in units of a page composed of a plurality of cells. Also, the flash memory 16 allows data to be deleted therefrom (i.e., initialized) in units of a block formed by a plurality of pages.

The internal RAM 13 is illustratively an SRAM or a DRAM. The internal RAM 13 is connected to the interface section 11 and the access control section 14. The internal RAM stores data that is transmitted and received between the storage apparatus 1 and the host device 2. For example, the internal RAM 13 stores the write data written to the storage apparatus 1 by the host device 2. The internal RAM 13 also stores read data that is retrieved from the flash memory 16. The internal RAM 13 need only have a capacity large enough to accommodate one block of data of the flash memory 16.

The buffer RAM 15 is illustratively an SRAM or a DRAM. The buffer RAM 15 is connected to the access control section 14 and the flash memory 16. Thus located, the buffer RAM 15 stores the data to be written to the flash memory 16 or the data read from the flash memory 16. The buffer RAM 15 need only have a capacity large enough to accommodate one page of data of the flash memory 16.

The access control section 14 is connected to the CPU 12, interface section 11, internal RAM 13, and buffer RAM 15. The access control section 14 manages and executes access to the flash memory 16. Illustratively, the access control section 14 writes or reads data to or from the flash memory 16 in units of a page, and deletes data from (i.e., initializes) the flash memory 16 in units of a block.

More specifically, given a data write command from the CPU 12, the access control section 14 reads write data from the internal RAM 13. The access control section 14 selects target pages in the flash memory 16 to which to write data, before writing the write data read from the internal RAM 13 to the buffer RAM 15. The flash memory 16 puts the write data retrieved from the buffer RAM 15 into multi-valued form and has the write data written to the pages selected by the access control section 14 for storage.

After writing the write data to the flash memory 16, the access control section 14 creates or updates a logical-to-physical address conversion table. The logical-to-physical address conversion table is a table for converting logical addresses of data to physical addresses in the flash memory 16. Illustratively, the logical-to-physical address conversion table is held in the buffer RAM 15.

Given a data read command from the CPU 12, the access control section 14 reads pages containing the read data from the flash memory 16. More specifically, the access control section 14 identifies the pages corresponding to the address of the read data using the logical-to-physical address conversion table and instructs the flash memory 16 to read the pages in question. The flash memory 16 writes to the buffer RAM 15 the data of the pages containing the read data. The access control section 14 retrieves the read data from the buffer RAM 15 and writes the read data to the internal RAM 13.

Furthermore, the access control section 14 manages use status of a plurality of blocks in the flash memory 16. If, say, unused initialized blocks are found lacking, the access control section 14 searches for the block containing the old data about the same logical pages and deletes the data from the block in question. The block from which the data has been deleted is initialized into an unused block.

The CPU 12, along with the access control section 14, functions as the control part of the storage apparatus 1. The CPU 12 is connected to the interface section 11 and the access control section 14. Through the interface section 11, the CPU 12 communicates with the host device 2 and interprets the access command coming from the host device 2 before executing the command. Also, the CPU 12 instructs the access control section 14 to access the flash memory 16.

Illustratively, if a write command is input through the interface section 11, the CPU 12 instructs the access control section 14 to perform the write process. The access control section 14 then reads write data from the internal RAM 13 through the interface section 11 in units of a page and writes the data to the flash memory 16. Upon completion of the write process by the access control section 14, the CPU 12 notifies the host device 2 through the interface section 11 that the data write is complete.

If a read command is input through the interface section 11, the CPU 12 instructs the access control section 14 to perform the read process. The access control section 14 retrieves read data from the flash memory 16 and writes the data to the internal RAM 13. With the read data stored in the internal RAM 13, the CPU 12 notifies the host device 2 through the interface section 11 that the preparations for a data read are complete.

[Structure of the Flash Memory 16]

Figure 2:
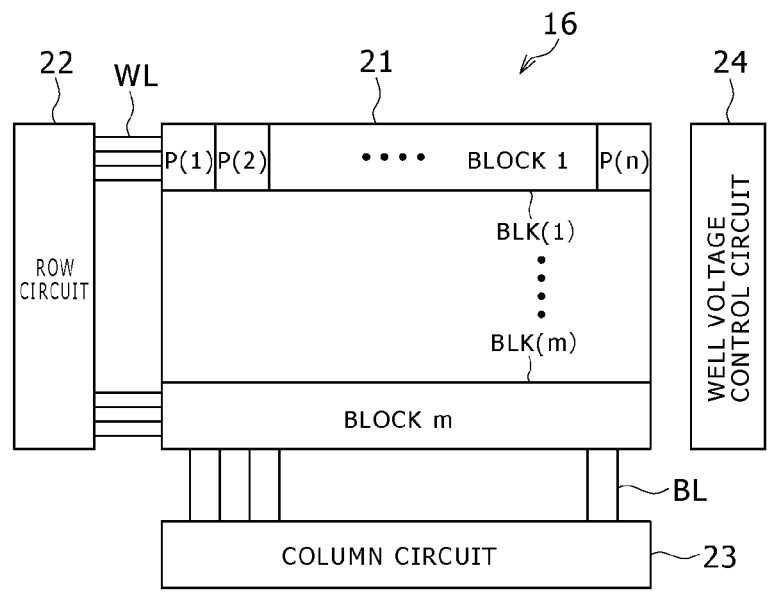
FIG. 2 is a schematic block diagram of a flash memory included in FIG. 1.

FIG. 2 is a schematic block diagram of the flash memory included in FIG. 1. The flash memory 16 includes a memory array 21, a row circuit 22, a column circuit 23, and a well voltage control circuit 24. These circuits 21 through 24 are typically laid out in a manner shown in FIG. 2 on a semiconductor substrate, not shown.

The memory array 21 has a plurality of blocks each containing a plurality of pages. In FIG. 2, the memory array 21 has m blocks BLK(1) through BLK(m), and each block has n pages P(1) through P(n). Generally, the flash memory 16 has thousands of blocks. Each page contains a plurality of cells, not shown. Each cell contains a plurality of transistors having a floating gate each. Using the floating gates, the cell may illustratively retain four threshold voltages representing two-bit data in multi-valued form.

The multiple cells are arranged into a two-dimensional matrix in those regions of the semiconductor substrate where the memory array 21 is formed. A plurality of word lines WL are connected to the multiple cells according to the latter's layout. These word lines WL are also connected to the row circuit 22. A plurality of bit lines BL are connected to the multiple cells according to the latter's layout. These bit lines BL are connected to the column circuit 23.

The row circuit 22 and the column circuit 23 select the multiple cells in units of a page or a block. The column circuit 23 illustratively reads the threshold voltages of each cell in the selected page, generates two-bit data corresponding to the threshold voltages of the cells, and outputs the resulting data as read data.

The well voltage control circuit 24 controls the voltages of P-wells on an N-type semiconductor substrate where the multiple cells are formed. Controlling the voltages of the P-wells allows one of the four threshold voltages corresponding to two bits to be written to each cell.

Figure 3:
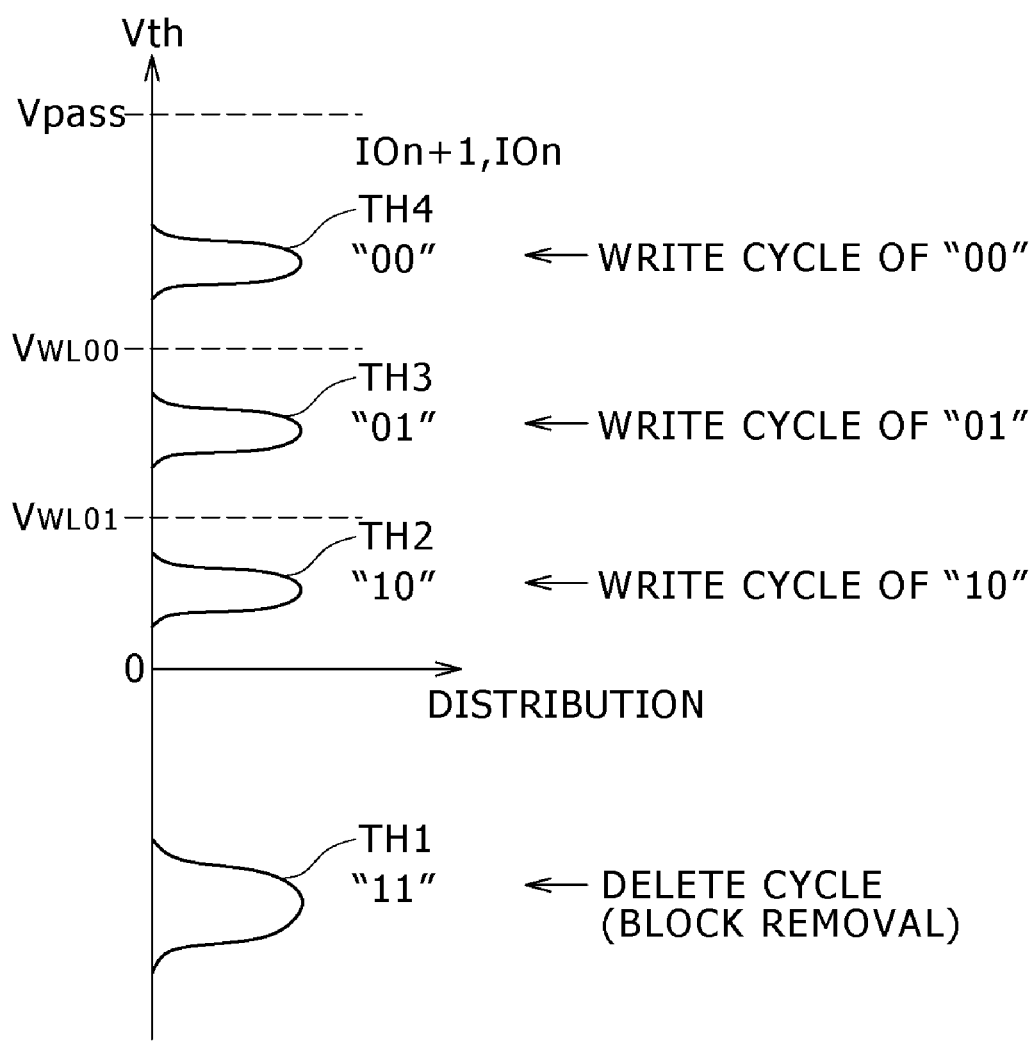
FIG. 3 is a schematic view explanatory of four typical threshold voltages to be written to the memory array shown in FIG. 2.

FIG. 3 is a schematic view explanatory of four typical threshold voltages to be written to each cell of the memory array 21 shown in FIG. 2. The vertical axis of FIG. 3 represents the threshold voltages and the horizontal axis denotes the distribution ratios of the threshold voltages regarding a plurality of cells. FIG. 3 indicates four threshold voltages to be written to each cell: a first threshold voltage TH1, a second threshold voltage TH2, a third threshold voltage TH3, and a fourth threshold voltage TH4.

The first threshold voltage TH1 is a voltage lower than 0 V and corresponds to a two-bit value such as "11." The first threshold voltage TH1 is written to the cells by the delete process performed in units of a block.

The second threshold voltage TH2 is a voltage higher than 0 V and corresponds to a two-bit value such as "10." The second threshold voltage TH2 is written to the cells by the data write process performed in units of a page.

The third threshold voltage TH3 is a voltage higher than the second threshold voltage TH2 and corresponds to a two-bit value such as "01." The third threshold voltage TH3 is written to the cells by the data write process performed in units of a page.

The fourth threshold voltage TH4 is a voltage higher than the third threshold voltage TH3 and corresponds to a two-bit value such as "00." The fourth threshold voltage TH4 is written to the cells by the data write process performed in units of a page.

In the process of writing data, it is necessary to put two pages of data into multi-valued form and to get the cells to retain the threshold voltages corresponding to the multi-valued data. Thus in the process of writing the data of two bits in multi-valued form, it is necessary to carry out three cycles on the cells having the first threshold voltage TH1 written thereto. The three cycles are made up of a first cycle in which to write the second threshold voltage TH2, a second cycle in which to write the third threshold voltage TH3, and a third cycle in which to write the fourth threshold voltage TH4.

Figure 4:
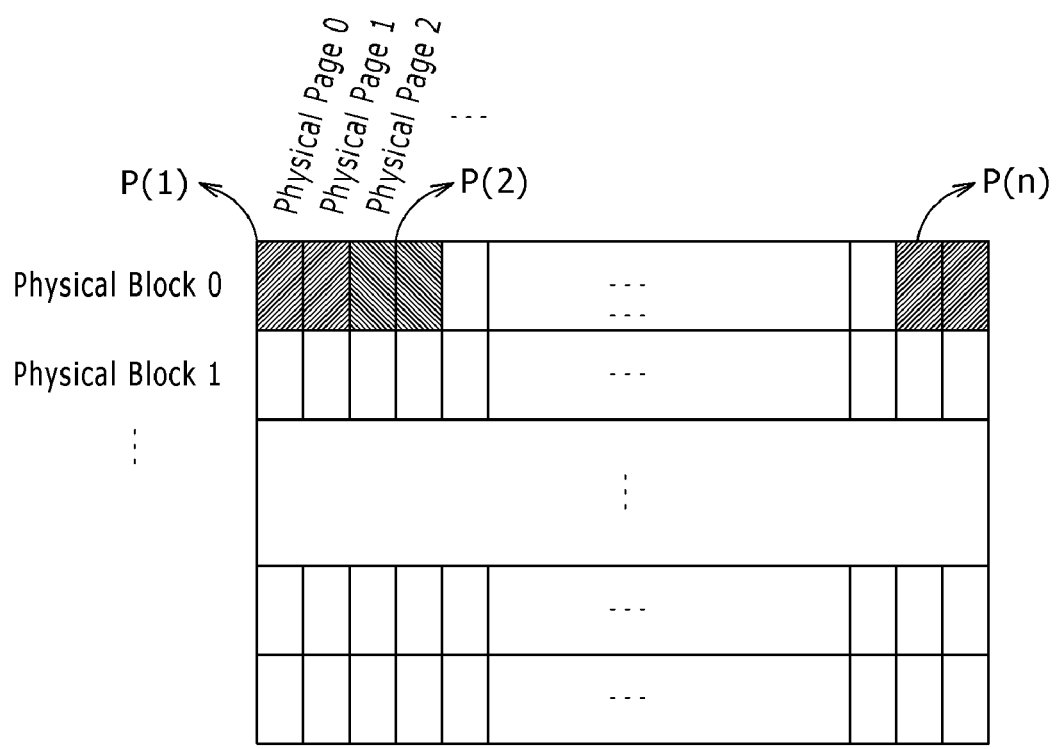
FIG. 4 is a schematic view explanatory of the corresponding relationship between pages and blocks in the flash memory included in FIG. 1.

FIG. 4 is a schematic view explanatory of the corresponding relationship between pages and blocks in the flash memory 16 indicated in FIG. 1. FIG. 4 shows a plurality of physical blocks 0, 1, etc. In FIG. 4, each row corresponds to one block. The block of each row is formed by a plurality of physical pages 0, 1, etc. Illustratively, the leftmost two pages in the topmost row in FIG. 4 are put in multi-valued form when written to a group of common cells in the flash memory 16. That is, the two pages of data are written to one page of the flash memory 16. For example, if the leftmost page has a bit value 0 and the second page from the left has a bit value 1, then the third threshold value TH3 in FIG. 3 is written to the cells where these two bit values are written.

Figures 5, 6:
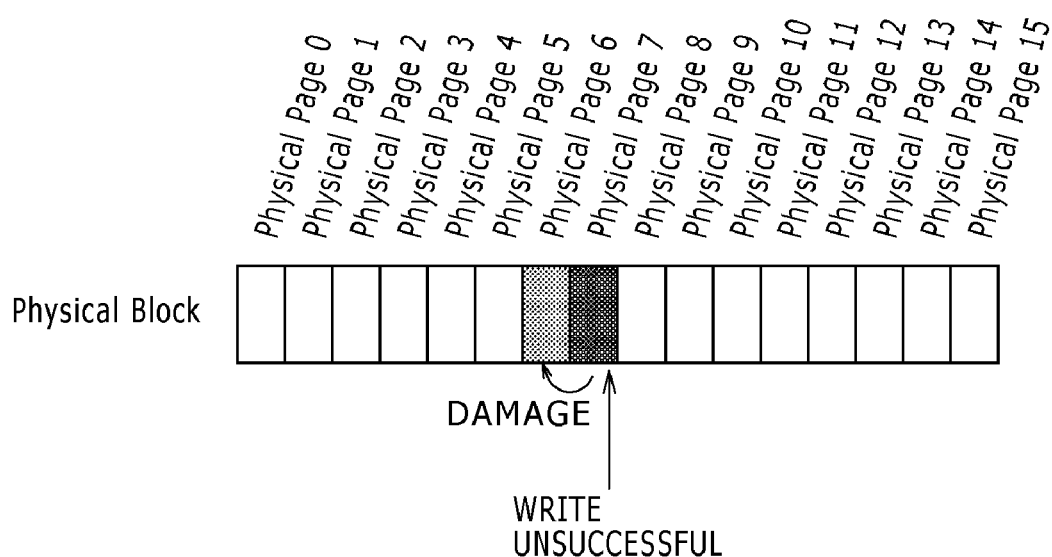
FIG. 5 is a schematic view explanatory of the corresponding relationship between two pages of write data on the one hand and one page of the flash memory to which to write the write data on the other hand.
FIG. 6 is a schematic view explanatory of how data can be lost where the corresponding relationship between the pages in FIG. 5 is in effect.

FIG. 5 is a schematic view explanatory of the corresponding relationship between two pages of write data on the one hand and one page of the flash memory to which to write the write data on the other hand. FIG. 5 shows a plurality of physical pages 0 through 15 accommodating write data. In FIG. 5, these multiple pages of write data are classified into group 1 and group 2. A page of group 1 and a page of group 2 shown in the same row are put in multi-valued form when written to a single page of the flash memory 16. In FIG. 5, the 16 physical pages 0 through 15 of write data are written to eight pages P1 through P8 of the flash memory 16.

Illustratively, physical page 0 and physical page 1 of write data are written to the first page P1 of the flash memory 16.

FIG. 6 is a schematic view explanatory of how data can be lost where the corresponding relationship between the pages in FIG. 5 is in effect. In FIG. 6, 16 physical pages 0 through 15 of write data are shown to be arrayed in a manner corresponding to one physical block of the flash memory 16.

Suppose now that the access control section 14 writes a sixth physical page 6 of write data before writing a seventh physical page 7. In such a case, if the process of writing the seventh physical page 7 of write data is unsuccessful, then the data of the sixth physical page 6 already written in the group of cells common to the seventh physical page 7 can be lost. The sixth physical page 6 of write data can thus be damaged by the failure to write the seventh physical page 7 of write data.

As described, the paired pages of group 1 and group 2 (e.g., physical pages 0 and 1) sharing the same row are stored in the same page of the flash memory 16. One of the paired pages can therefore be damaged if an attempt to write the other page fails.

Also, one of the paired pages sharing the same row in FIG. 5 tends to be written earlier than the other page. In the description that follows, it is assumed that the pages of group 1 are written earlier than the pages of group 2.

Figure 7A:
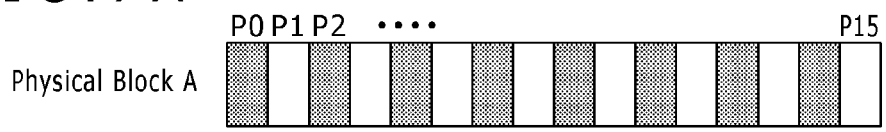
FIGS. 7A, 7B and 7C are schematic views explanatory of a virtual block for use when data is written to the flash memory shown in FIG. 1.
Figure 7B:
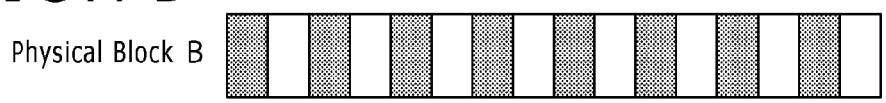
Figure 7C:
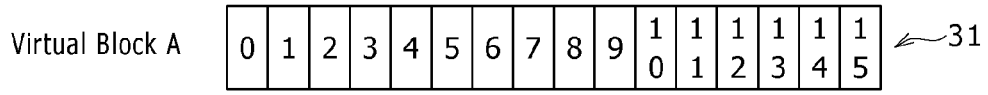

With the first embodiment of this invention, a virtual block is used to prevent inadvertent data erasure during the process of writing data. FIGS. 7A, 7B and 7C are schematic views explanatory of a virtual block 31 to be used when the CPU 12 writes data to the flash memory 16. FIGS. 7A and 7B show initialized, unused physical blocks A and B of the flash memory 16. Each of these blocks is made up of 16 unused pages P0 through P15.

As shown in FIG. 7C, the access control block 14 creates a virtual block 31 with regard to the two unused blocks of the flash memory 16 indicated in FIGS. 7A and 7B. The access control block 14 may create a plurality of virtual blocks 31 relative to a plurality of pairs of blocks of the flash memory 16.

The virtual block 31 is formed by eight unused pages P0, P2, P4, P6, . . . , P14 selected from the block A in FIG. 7A and by eight unused pages P0, P2, P4, P6, . . . , P14 selected from the block B in FIG. 7B. The virtual block 31 is established using only the pages of the group to be written earlier (e.g., group 1 in FIG. 5) for each pair of blocks in the flash memory 16. This arrangement makes the average write speed of each page higher than if all pages of one block in the flash memory 16 are set for the virtual block 31.

In terms of the pages to which to write data in each block of the flash memory 16, the pages of the virtual block 31 are not paired unlike in the case of FIG. 5 where the pages of group 1 and those of group 2 are paired. As a result, even if a write error occurs in a given page of the virtual block 31, the data of that page alone is damaged. There is no possibility of the data of the other pages getting lost.

Unlike with this embodiment, when three-bit data is put into multi-valued form before the relevant threshold voltages are written to each cell of the flash memory 16, the virtual block 31 may be defined using three unused blocks of the flash memory 16. Likewise, when four-bit data is put in multi-valued form, the virtual block 31 may be defined using four unused blocks of the flash memory 16; when five-bit data is put in multi-valued form, the virtual block 31 may be defined using five unused blocks of the flash memory 16.

When writing new write data to the flash memory 16, the CPU 12 writes the data to an unused virtual block 31 in units of a page. The process of writing data to the unused virtual block 31 causes the data of only the first page out of two writable pages of data to be written to each group of cells in those unused blocks of the flash memory 16 which correspond to the virtual block 31.

The virtual block 31 may be stored in storage areas of the internal RAM 13, buffer RAM 15, or flash memory 15 in a manner accessible by the control part of the storage apparatus 1 such as the CPU 12 and access control section 14.

[Process of Writing Write Data]

Figure 8:
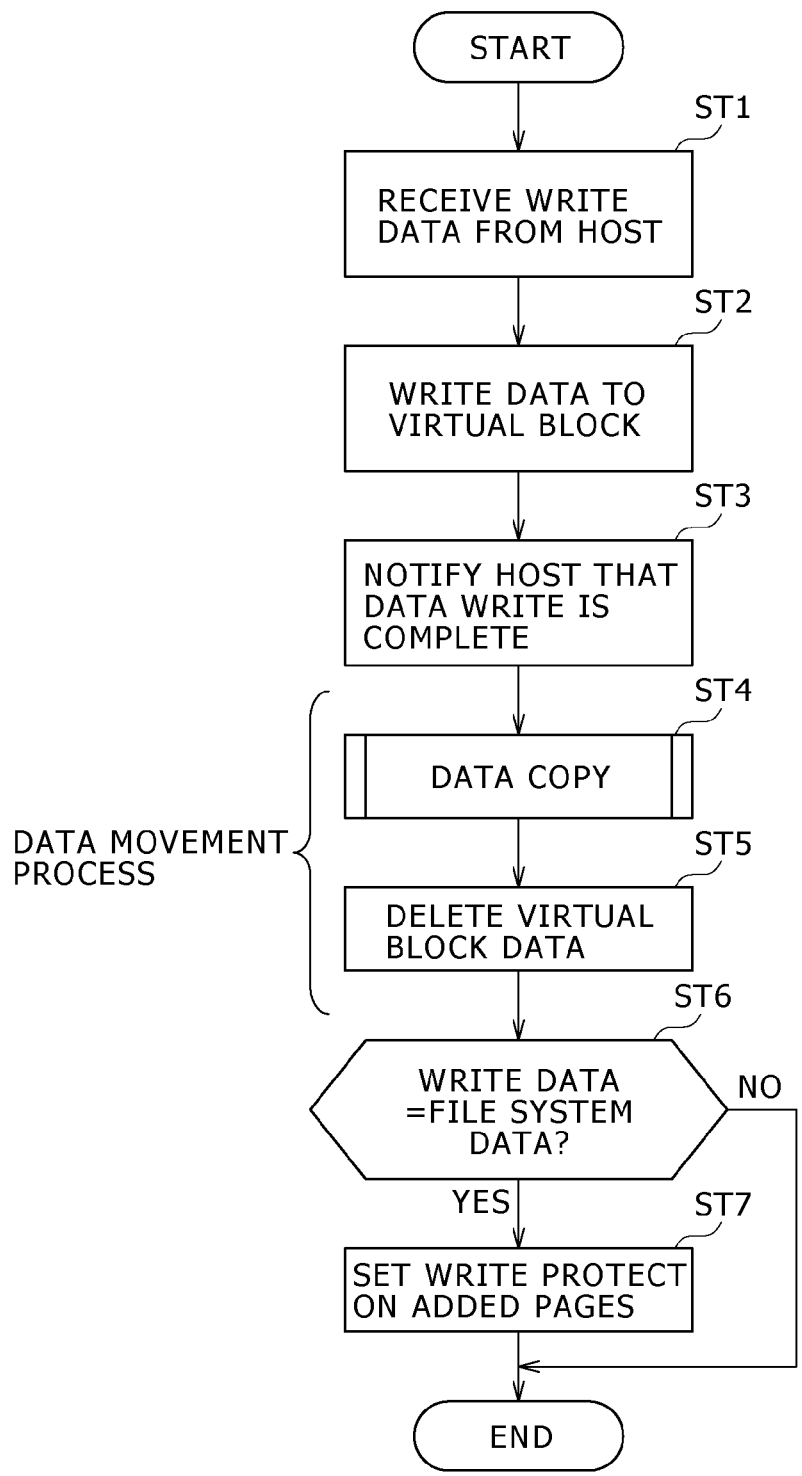
FIG. 8 is a flowchart of a write process performed by the storage apparatus of FIG. 1.

The write process carried out by the storage apparatus 1 in FIG. 1 will now be described in detail. FIG. 8 is a flowchart of the write process performed by the storage apparatus 1 in FIG. 1.

When the host device 2 outputs write data to the storage apparatus 1, the storage apparatus 1 receives the write data through the interface section 11 (in step ST1). The write data received by the storage apparatus 1 is written to the internal RAM 13. The write data to be written to the storage apparatus 1 by the host device 2 is first retained in the internal RAM 13.

The CPU 12 of the storage apparatus 1 then starts the process of writing to the flash memory 16 the write data stored in the internal RAM 13 (in step ST2). Illustratively, the CPU 12 starts the write process when a write command is input from the host device 2 through the interface section 11 or when a predetermined amount of data is found accumulated in the internal RAM 13.

The CPU 12 selects an unused virtual block 31 from a plurality of virtual blocks 31 established in the flash memory 16. The CPU 12 proceeds to instruct the access control section 14 to write the data to the selected virtual block 31.

The unused virtual block 31 is formed by a plurality of initialized, data-free blocks in the flash memory 16. Those multiple blocks of the flash memory 16 which correspond to the unused virtual block 31 thus have no write data stored therein.

The access control section 14 writes the write data held in the internal RAM 13 to unused pages of the virtual block 31 on a page-by-page basis. In practice, the access control section 14 writes the write data to those pages of the flash memory 16 which correspond to the unused pages of the virtual block 31 one page at a time.

In the process of writing the data to each page of the virtual block 31, only the pages of group 1 in the flash memory 16 shown in FIG. 5 are used to accommodate the write data; the pages of group 2 are not used. For this reason, during the process of writing data to each page, the access control section 14 need only carry out the write cycle in which to write the third threshold voltage TH3, out of the four threshold values shown in FIG. 3, to the cells in which the first threshold voltage TH1 has been written.

Following the write process, the cells retain the third threshold voltage TH3 corresponding to two-bit data "01" or the first threshold voltage TH1 corresponding to two-bit data "11." In this case, the higher of the two bits corresponds to the data bit read from the internal RAM 13.

Unlike in the case of writing two pages of data in multi-valued form, there is no need to perform the second cycle in which to write the third threshold voltage TH3 and the third cycle in write to write the fourth threshold voltage TH4. This arrangement helps accelerate the process of writing data to each page of the virtual block 31.

Upon normally completing the process of writing data to those pages of the flash memory 16 which correspond to the pages of the virtual block 31, the access control section 14 terminates the process of writing data to the virtual block 31. If the write process was not completed normally in a given page, the access control section 14 again reads the page in question from the internal RAM 13 and attempts to write the page again.

When the access control section 14 completes the process of writing data to the virtual block 31, the CPU 12 notifies the host device 2 that the write process is complete (in step ST3). Specifically, the CPU 12 sends a write complete notification to the host device 2 through the interface section 11.

Upon completion of the process of writing the write data to the virtual block 31, the access control section 14 carries out the process of moving the data from the virtual block 31 to blocks of the flash memory 16. First, the access control section 14 copies the data from the virtual block 31 to blocks of the flash memory 16 (in step ST4).

Figure 9:
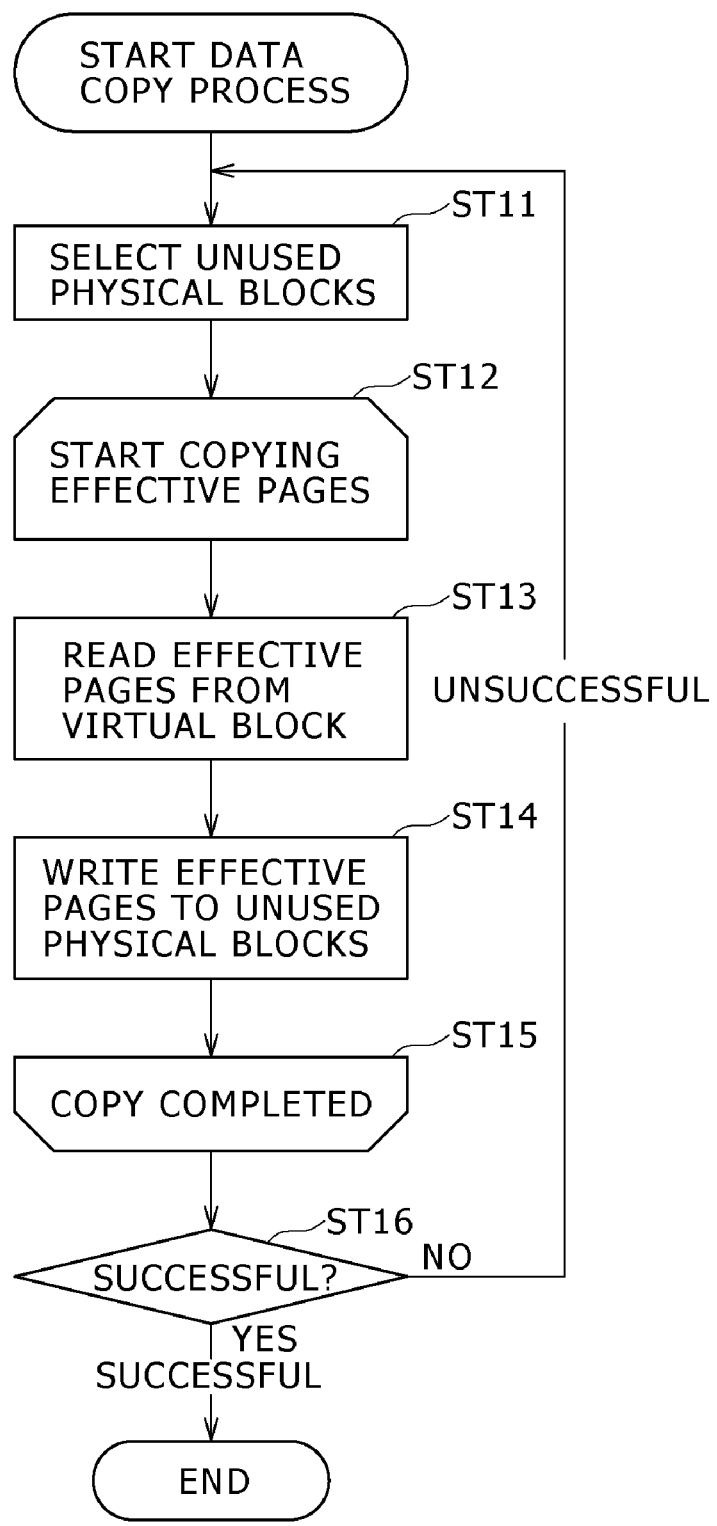
FIG. 9 is a detailed flowchart of step ST4 in FIG. 8.

FIG. 9 is a flowchart of the process performed by the access control section 14 in FIG. 1 (i.e., step ST4 in FIG. 8) for copying the data from the virtual block 31 to the flash memory 16. In the data copy process, the access control section 14 first selects unused blocks of the flash memory 16 (in step ST11).

The access control section 14 then starts copying the effective pages of the virtual block 31 to the unused blocks (in step ST12). More specifically, the access control section 14 first reads the data of the effective pages from the virtual block 31 (in step ST13). The access control section 14 then writes the data of the effective read pages to the selected unused blocks of the flash memory (in step ST14). The effective pages signify the most recent pages of the same logical address.

Upon completion of copying all effective pages of the virtual block 31 (in step ST15), the access control section 14 checks to determine whether the data copy process is successful (in step ST16). If the data copy process is found successful, the access control section 14 brings this process to an end. If the process of copying the data of any one effective page is found unsuccessful, then the access control section 14 repeats steps ST11 through ST16.

If the data to be copied turns out to be system data, the access control section 14 puts the data of the virtual block 31 into multi-valued form on a page-by-page basis before copying the data to the pages of the blocks in the flash memory one page at a time. After the copy process, the system data is copied to the other blocks of the flash memory 16 in the same state as that of the blocks in FIGS. 7A and 7B.

Upon completion of the process of copying the data from the virtual block 31, the access control section 14 deletes the data of the virtual block 31 as indicated in FIG. 8. If the attempt to copy the data to a given block of the flash memory 16 is found to have failed, then the access control section 14 performs the process of deleting the block in question along with the virtual block 31 (in step ST5).

Upon completion of the process of moving the data of the virtual block 31, the access control section 14 checks to determine the type of the written data (in step ST6). If the written data is found to be system data, the access control section 14 sets a write protect against adding data to the blocks into which the data was copied (in step ST7).

The system data includes file allocation tables (FAT), directory entries, and system security data. If the system data is destroyed, files stored in the storage apparatus 1 may become invisible, or a boot process by use of the storage apparatus 1 may become unavailable.

In the copy process of step ST14 in FIG. 9, the access control section 14 may write the data to only the first unused page (see FIG. 5) of each of the blocks in the flash memory 16 as when the write data was written to the virtual block 31. In this case, there is no need for the access control section 14 to carry out steps ST6 and ST7 in FIG. 8. Even without the specific decision and protect setting carried out in steps ST6 and ST7 depending on the type of the write data, the first-page data will not be lost by the failure to add data to the second page paired with the first page having the data already written therein.

With the first embodiment, as described above, the data of at least two bits over a plurality of pages is put into multi-valued form when written to the storage apparatus 1. This arrangement doubles the storage capacity of the storage apparatus 1. That in turn allows the first embodiment to lower the cost per unit bit significantly.

Also with the first embodiment, data is written to unused pages of memory (i.e., virtual block 31) on a page-by-page basis. In addition, when data is written to each page of the virtual block 31, the first embodiment is arranged to omit some write cycles so that the time required to write data per unit page is reduced. Thus the first embodiment prevents the drop in write speed that could penalize the storage apparatus 1 getting data stored therein in multi-valued form, while enhancing the reliability in retaining the written data at the same time.

When writing a plurality of pages of write data to the flash memory 16, the first embodiment writes each page of the write data to a different unused page of the flash memory 16 on a page-by-page basis. Thus during the write process, the first embodiment does not write additional data to any page having data already written therein in the memory. This protects the first embodiment against losing data from the pages to which additional data might otherwise be written.

The data written to the flash memory 16 is not deleted inadvertently during the process of writing data to the flash memory 16. The written data is thus stored unfailingly in the flash memory 16.

By contrast, while a plurality of pages of write data are being written to the pages of the flash memory 16 in units of multiple pages, a second or subsequent attempt to write data to a given page might fail. In such a case, the entire data written already in the page in question can be lost.

Also, the first embodiment utilizes virtual blocks 31 in the process of writing data; each page of the write data is written only to unused page of the flash memory 16. Thus in writing the data to each page of the flash memory 16, the first embodiment permits adoption of the most efficient way of writing the data.

More specifically, when writing one page of data to an unused page of the flash memory 16, the first embodiment typically performs the process of writing one value (e.g., third threshold voltage) to the page. That is, upon writing each page of write data, the first embodiment carries out a single-cycle write process in the same manner as writing only one-bit data to each page of the flash memory 16.

For that reason, the first embodiment has no need for performing all write cycles (e.g., 3 cycles) in which to write all values (4 values in this case) of the data in multi-valued form to each page of the flash memory 16. As a result, the first embodiment reduces the time it takes to write data per page compared with the case where a plurality of pages of write data are written to each page of the flash memory 16. Overall, the first embodiment shortens the time required to write multiple pages of write data to the flash memory 16.

Furthermore, the first embodiment is arranged not to write additional data of any other page to those blocks in the flash memory 16 which retain system data. With this arrangement, the first embodiment increases the reliability in retaining system data in the storage apparatus 1 alongside with other types of data.

By contrast, the pages that have data other than the system data stored therein are protected against additional data entries. These pages are made available for data entries of other pages as usual. Thus the first embodiment boosts system data reliability without reducing the storage capacity that is doubled thanks to the multi-valued attributes of data.

Also, the first embodiment moves the data stored temporarily in the virtual block 31 to other blocks of the flash memory 16. In this case, following the writing of the temporarily stored data from the virtual block 31 to the other blocks, the first embodiment causes the data in question to be deleted from the virtual block 31. That is, while the data is being moved from the virtual block 31 to the other blocks, the data written to the flash memory 16 still exists in the virtual block 31.

For that reason, if the attempt to move the data to the other blocks fails and the moved data is thereby lost, the data still present in the virtual block 31 can be tapped again to replace the lost data in the blocks.

The series of processes described above thus allows the first embodiment to retain reliably each block of data written to the flash memory 16.

<2. Second Embodiment>

The storage apparatus 1 implemented as the second embodiment of the invention is structured substantially the same as the storage apparatus 1 implemented as the first embodiment and explained above in reference to FIGS. 1 through 7C. The major difference between the second embodiment and the first embodiment lies in the manner in which the virtual block 31 is deleted and the process of writing data is carried out. More specifically, the process of moving data from the virtual block 31 to other blocks in the flash memory 16 is carried out in the background apart from the data write process.

The components of the storage apparatus 1 as the second embodiment are functionally the same as those with the same names of the first embodiment. Throughout these embodiments, like components are designated by like reference numerals, and descriptions of such components will be omitted where redundant.

Figure 10:
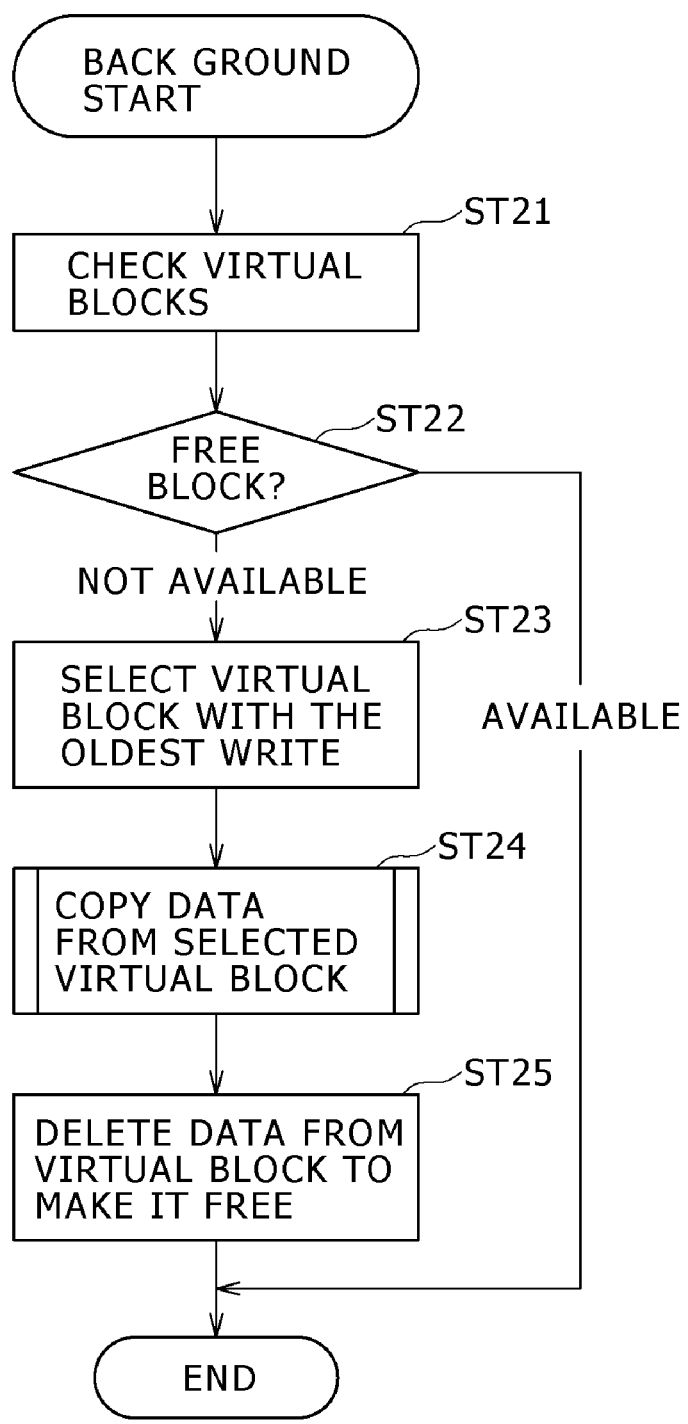
FIG. 10 is a flowchart of a data movement process of the virtual block performed by a second embodiment of the present invention.

FIG. 10 is a flowchart of the data movement process performed by the access control section 14 of the second embodiment to move data from the virtual block 31. The access control section 14 repeats the process shown in FIG. 10 apart from the write process.

In performing the data movement process on the virtual block 31, the access control section 14 first checks the use status of all virtual blocks 31 (in step ST21). The access control section 14 checks to determine whether any unused (i.e., data-free) virtual block 31 exists (in step ST22). If an unused virtual block 31 is found to exist, the access control section 14 terminates the data copy process on the virtual block 31.

On the other hand, if none of the virtual blocks 31 is found unused, then the access control block 14 selects the virtual block 31 with the oldest write (in step ST23). The access control section 14 proceeds to perform the process of copying the data from the selected virtual block 31 to other blocks of the flash memory 16 (in step ST24). This copy process may illustratively be one shown in FIG. 9. Upon completion of the copying of data from the virtual block 31 to the other blocks in the flash memory 16, the access control section 14 deletes the virtual block 31 in question (in step ST25). With this step, the access control section 14 creates an unused virtual block 31.

Figure 11:
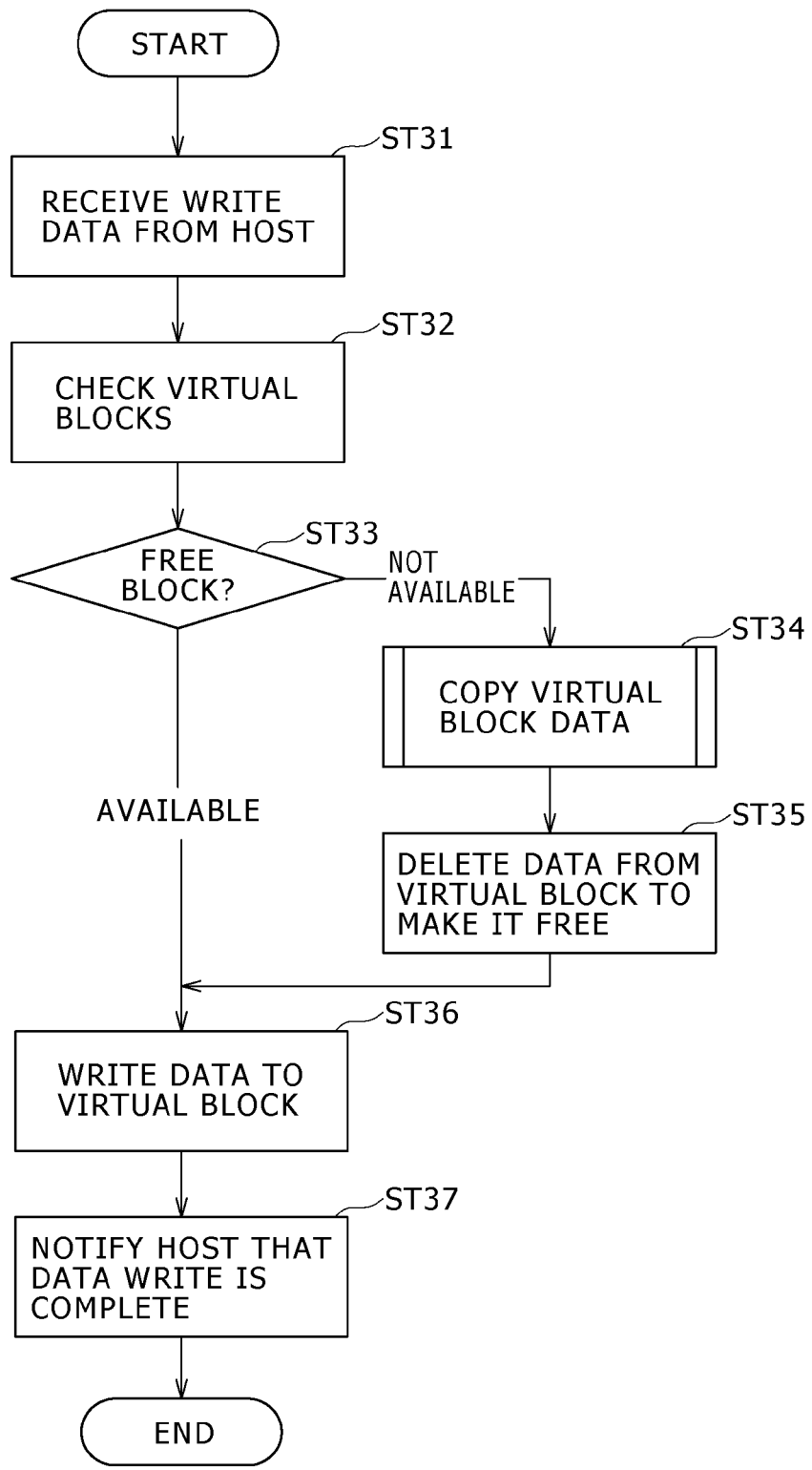
FIG. 11 is a flowchart of a write process performed by the second embodiment.

FIG. 11 is a flowchart of the write process performed by the storage apparatus 1 as the second embodiment. Upon receipt of write data from the host device 2 (in step ST31), the storage apparatus 1 captures the write data via the interface section 11 and stores the received data into the internal RAM 13.

The CPU 12 of the storage apparatus 1 then starts the process of writing the accumulated write data from the internal RAM 13 to the flash memory 16. Illustratively, when a write command is input from the host device 2 through the interface section 11 or when a predetermined amount of data is found accumulated in the internal RAM 13, the CPU 12 starts writing the data to the flash memory 16.

The CPU 12 first checks the virtual blocks 31 to determine whether there exists any unused (i.e., data-free) virtual block 31 (in steps ST32 and ST33). If none of the virtual blocks 31 is found unused, the CPU 12 instructs the access control section 14 to move the data from the virtual blocks 31 using commands apart from those of the write process.

By carrying out the process shown in FIG. 10, the access control section 14 copies data from the virtual block 31 to other blocks in the flash memory 16 (in step ST34). The access control section 14 then deletes the data from the virtual block 31 in question (in step ST35). With this step, the access control section 14 creates an unused virtual block 31.

If an unused virtual block 31 is found to exist or if an unused virtual block 31 is created, the CPU 12 starts the process of writing the write data to the virtual block 31. The CPU 12 first selects the unused virtual block 31, and instructs the access control section 14 to write the data to the selected virtual block 31 (in step ST36). Upon completion of the writing of the data to the virtual block 31 by the access control section 14, the CPU 12 notifies the host device 2 that the write process is complete (in step ST37). Specifically, the CPU 12 sends a write complete notification to the host device 2 through the interface section 11.

In order to carry out the process of writing data to the virtual block 32 as shown in FIG. 11, it is generally necessary to have a plurality of virtual blocks 31 prepared beforehand. In such a case, the CPU 12 may illustratively set virtual blocks 31 on all blocks in the flash memory 16. This allows the access control section 14 during the data write process to write large amounts of data successively at high speed to the virtual blocks 31 making up about half the capacity of the flash memory 16.

As needed, the access control section 14 may perform the process of creating an unused virtual block 31 as indicated in FIG. 10. This helps boost data write speed while the loss of data is averted.

As described above, the second embodiment terminates the process of writing data to the flash memory 16 upon completion of the writing of the data to the virtual block 31. That is, the data write process on the flash memory 16 is terminated when the data is written once to the flash memory 16. This allows the second embodiment to shorten the time required to write data to the flash memory 16.

By contrast, the first embodiment entails writing each data item twice: in the process of writing data to the first block 31 and in the process of moving data from the virtual block 31 to other blocks of the flash memory 16, the two processes being performed sequentially.

Although the description above contains many specificities, these should not be construed as limiting the scope of the invention but as merely providing illustrations of some of the presently preferred embodiments of this invention. It is to be understood that changes and variations may be made without departing from the spirit or scope of the claims that follow.

For example, the above-described embodiments were shown to put two pages of two-bit write data into multi-valued form before getting them stored into the flash memory 16. Alternatively, the flash memory 16 may be arranged to have write data of at least three bits in at least three pages put into multi-valued form before storing the data. In this case, the control part may prepare a virtual block 31 by combining first pages to be initially written to unused pages of the flash memory 16 before writing the write data to this virtual block 31.

With the above-described embodiments, the control part such as the CPU 12 was shown to utilize the virtual blocks 31 when carrying out the data write process. Alternatively, without recourse to the virtual blocks 31, the control part may individually select unused pages of the flash memory 16 and write the data to the selected pages on a page-by-page basis.

When writing write data to the virtual block 31, the control part of the above-described embodiments was shown to put the write data into multi-valued form on the assumption that the other pages of write data to be put into multi-valued form along with the pages of the virtual block 31 are fixed to a predetermined value (e.g., 1). Alternatively, the control part may put the write data into multi-valued form assuming that the other pages of write data to be put into multi-valued form along with the pages of the virtual block 31 are set to some other desired value. As another alternative, the control part may write one-bit data not in multi-valued form to those pages of the flash memory 16 which correspond to the pages of the virtual block 31.

With the above-described embodiments, the storage apparatus 1 was shown to have the flash memory 16 to which to write and in which to retain the write data. Alternatively, the storage apparatus 1 may be arranged to have a nonvolatile memory such as UV-EPROM or EEPROM to which to write and in which to retain data. As another alternative, the storage apparatus 1 may be arranged to have a volatile memory such as RAM to which to write data.

With the above-described embodiments, the storage apparatus 1 was shown to be a card type storage apparatus. Alternatively, the storage apparatus 1 may be a USB memory or a built-in type storage module such as SSD or eMMC. Some eMMC products are boot-capable storage modules that may be used in conjunction with the arrangements of this invention.

With the above-described embodiments, the host device 2 was shown typically to be a computer. Alternatively, the host device 2 may be a mobile phone or some other suitable electronic device.

The present application contains subject matter related to that disclosed in Japanese Priority Patent Application JP 2010-009890 filed in the Japan Patent Office on Jan. 20, 2010, the entire content of which is hereby incorporated by reference.

Thus the scope of the invention should be determined by the appended claims and their legal equivalents, rather than by the examples given.

What is claimed is:

1. A storage apparatus comprising:
   a memory configured to have a plurality of pages to which data can be written in units of a page, said memory being further configured to have a plurality of pages of write data stored into each page in multi-valued form; and
   a control section configured to select pages to which to write the data from among said plurality of pages of said memory, said control section being further configured to write to the selected pages of said memory the data of at least two bits in multi-valued form for a plurality of pages including the selected pages;
   wherein, when writing said plurality of pages of said write data, said control section puts said write data into multi-valued form per page before writing the data to a plurality of different unused pages of said memory on a page-by-page basis.

2. The storage apparatus according to claim 1, wherein said control section determines the type of said write data; and
   if said write data is found to be system data, then said control section does not additionally write any other page of data to said plurality of pages of said memory to which said system data is written on a page-by-page basis.

3. The storage apparatus according to claim 1, wherein, when writing the data of at least two bits from said plurality of pages in multi-valued form, said control section performs the process of writing one of multiple values that may be taken up by the multi-valued form, for writing said write data to each of said unused pages on a page-by-page basis.

4. The storage apparatus according to claim 1, wherein, when writing said plurality of pages of said write data to said plurality of pages of said memory on a page-by-page basis, said control section writes said write data one page at a time to a virtual block constituted by a plurality of pages making up the first pages of a plurality of unused pages of said memory; and
   said control section writes the data written in said virtual block to another block constituted by a plurality of pages of said memory which do not belong to said virtual block, said control section further deleting the data from said virtual block upon completion of the writing of the data to said another block.

5. The storage apparatus according to claim 4, wherein said control section terminates the process of writing said plurality of pages of said write data to said memory upon completion of the writing of the data to said virtual block; and
   said control section moves the data from said virtual block to said another block in a background process other than the write process.

6. A data writing method comprising the steps of:
   selecting, from a memory capable of having a plurality of pages of write data stored therein in multi-valued form, unused pages to which to write a plurality of pages of said write data;
   putting said write data into multi-valued form on a page-by-page basis; and
   writing said write data in multi-valued form to the selected unused pages on a page-by-page basis.

* * * * *